United States Patent
Khojasteh et al.

(10) Patent No.: US 7,087,356 B2
(45) Date of Patent: Aug. 8, 2006

(54) 193NM RESIST WITH IMPROVED POST-EXPOSURE PROPERTIES

(75) Inventors: Mahmoud H. Khojasteh, Poughkeepsie, NY (US); Kuang-Jung Chen, Poughkeepsie, NY (US); Pushkara Rao Varanasi, Poughkeepsie, NY (US); Yukio Nishimura, Mie (JP); Eiichi Kobayashi, Mie (JP)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 224 days.

(21) Appl. No.: 10/261,249

(22) Filed: Sep. 30, 2002

(65) Prior Publication Data

US 2004/0063024 A1    Apr. 1, 2004

(51) Int. Cl.
G03C 1/73 (2006.01)
G03F 7/039 (2006.01)
G03F 7/20 (2006.01)
G03F 7/30 (2006.01)
G03F 7/36 (2006.01)
G03F 7/38 (2006.01)

(52) U.S. Cl. .................. 430/270.1; 430/326; 430/311; 430/313; 430/330; 430/317; 430/905; 430/907; 430/910; 430/914

(58) Field of Classification Search ............ 430/270.1, 430/326, 905, 907, 910, 914, 311, 313, 317, 430/328, 330
See application file for complete search history.

(56) References Cited

U.S. PATENT DOCUMENTS

| | | | | |
|---|---|---|---|---|
| 6,051,362 | A | * | 4/2000 | Choi et al. ............... 430/270.1 |
| 6,114,422 | A | | 9/2000 | Choi .......................... 524/247 |
| 6,140,015 | A | | 10/2000 | Varanasi et al. ......... 430/281.1 |
| 6,399,274 | B1 | | 6/2002 | Kinsho et al. ........... 430/270.1 |
| 6,489,080 | B1 | * | 12/2002 | Uenishi et al. .......... 430/281.1 |
| 6,610,457 | B1 | * | 8/2003 | Kim et al. ............... 430/271.1 |
| 6,703,171 | B1 | * | 3/2004 | Hattori et al. ................. 430/5 |
| 6,764,811 | B1 | * | 7/2004 | Endo et al. ................ 430/322 |
| 6,770,417 | B1 | * | 8/2004 | Nozaki et al. ........... 430/270.1 |
| 2001/0026901 | A1 | * | 10/2001 | Maeda et al. ............ 430/270.1 |
| 2003/0077540 | A1 | * | 4/2003 | Kodama et al. ......... 430/270.1 |

FOREIGN PATENT DOCUMENTS

| EP | 1 162 506 A1 | * 12/2001 |
|---|---|---|
| EP | 1184723 A2 | * 3/2002 |
| JP | 92002220416 A | 8/2002 |

* cited by examiner

*Primary Examiner*—Sin Lee
(74) *Attorney, Agent, or Firm*—Steven Capella

(57) ABSTRACT

Acid-catalyzed positive resist compositions which are imageable with 193 nm radiation and/or possibly other radiation and are developable to form resist structures of improved development characteristics and improved etch resistance are enabled by the use of resist compositions containing imaging polymer component comprising an acid-sensitive polymer having a monomeric unit with a pendant group containing a remote acid labile moiety.

14 Claims, No Drawings

193NM RESIST WITH IMPROVED POST-EXPOSURE PROPERTIES

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of lithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for lithographic processes. Recently, the trend has been to move from so-called I-line radiation (350 nm) to 248 nm radiation. For future reductions in size, the need to use 193 nm radiation appears likely. Unfortunately, photoresist compositions at the heart of current 248 nm lithographic processes are typically unsuitable for use at shorter wavelengths.

While a resist composition must possess desirable optical characteristics to enable image resolution at a desired radiation wavelength, the resist composition must also possess suitable chemical and mechanical properties to enable transfer to the image from the patterned resist to an underlying substrate layer(s). Thus, a patternwise exposed positive resist must be capable of appropriate dissolution response (i.e. selective dissolution of exposed areas) to yield the desired resist structure. Given the extensive experience in the lithographic arts with the use of aqueous alkaline developers, it is important to achieve appropriate dissolution behavior in such commonly used developer solutions.

The patterned resist structure (after development) must be sufficiently resistant to enable transfer of the pattern to the underlying layer(s). Typically, pattern transfer is performed by some form of wet chemical etching or ion etching. The ability of the patterned resist layer to withstand the pattern transfer etch process (i.e., the etch resistance of the resist layer) is an important characteristic of the resist composition.

While some resist compositions have been designed for use with 193 nm radiation, these compositions have generally failed to deliver the true resolution benefit of shorter wavelength imaging due to a lack of performance in one or more of the above mentioned areas. For example, there is a desire for resist compositions exhibiting improved development characteristics (e.g., resolution, development speed, contrast, shrinkage, etc.), improved etch resistance, and improved lithographic process window. There is especially a desire for resist compositions having improved exposure dose latitude, reduced sensitivity to fluctuations in post-exposure bake, and reduced line edge roughness.

SUMMARY OF THE INVENTION

The invention provides resist compositions which are capable of high resolution lithographic performance with (a) good exposure dose latitude, (b) reduced sensitivity to fluctuations in post-exposure bake and/or (c) reduced line edge roughness. The resists of the invention are preferably imageable using 193 nm imaging radiation (and possibly also with other imaging radiation). The resist compositions of the invention are characterized by the presence of an imaging polymer component comprising an acid-sensitive polymer having remote acid-labile pendant moieties.

The invention also provides lithographic methods using the resist compositions of the invention to create resist structures and methods using the resist structures to transfer patterns to an underlying layer(s). The lithographic methods of the invention are preferably characterized by the use of 193 nm ultraviolet radiation patternwise exposure.

In one aspect, the invention encompasses a resist composition comprising: (a) an imaging polymer component, and (b) a radiation-sensitive acid generator, the imaging polymer component comprising an acid-sensitive polymer having monomeric units having group pendant from the polymerizing portion of the monomeric unit, the pendant group containing a remote acid labile moiety. The remote acid-labile pendant moieties may be pendant from acrylic monomeric units, cyclic olefin monomeric units or from other desired monomeric units forming the backbone of the acid-sensitive polymer. In the absence of generated acid, the remote acid-labile pendant moieties preferably inhibit solubility of the resist in aqueous alkaline solutions. Preferably, the acid-sensitive polymer contains (i) cyclic olefin monomeric units in the polymer backbone (i.e., the polymerizable portion of monomeric units making up the polymer), and/or (ii) alicyclic moieties pendant from at least some monomeric units making up the polymer. In the absence of generated acid, the acid-sensitive polymer is preferably substantially insoluble in aqueous alkaline solutions such that the resist is a positive resist.

In another aspect, the invention encompasses a method of forming a patterned material structure on a substrate, the method comprising:

(A) providing a substrate with a layer of the material,
(B) applying a resist composition to the substrate to form a resist layer on the substrate, the resist composition comprising (a) an imaging polymer component, and (b) a radiation sensitive acid generator, the imaging polymer component comprising an acid-sensitive polymer having monomeric units having a group pendant from a polymerizing portion of the monomer, the pendant group containing a remote acid-labile moiety;
(C) patternwise exposing said substrate to radiation whereby acid is generated by said acid generator in exposed regions of said resist layer by said radiation,
(D) contacting said substrate with an aqueous alkaline developer solution, whereby said exposed regions of said resist layer are selectively dissolved by said developer solution to reveal a patterned resist structure, and
(E) transferring resist structure pattern to said material layer, by etching into said material layer through spaces in said resist structure pattern.

Preferably, the radiation used in step (B) in the above method is 193 nm ultraviolet radiation. The material to be patterned is preferably selected from the group consisting of organic dielectrics, semiconductors, ceramics, and metals.

These and other aspects of the invention are discussed in further detail below.

DETAILED DESCRIPTION OF THE INVENTION

The invention provides resist compositions which are capable of high resolution lithographic performance with (a) good exposure dose latitude, (b) reduced sensitivity to fluctuations in post-exposure bake and/or (c) reduced line edge roughness. The resists of the invention are preferably imageable using 193 nm imaging radiation (and possibly also with other imaging radiation). The resist compositions of the invention are characterized by the presence of an imaging polymer component comprising an acid-sensitive polymer having remote acid-labile pendant moieties.

The invention also provides lithographic methods using the resist compositions of the invention to create resist structures and methods using the resist structures to transfer patterns to an underlying layer(s). The lithographic methods of the invention are preferably characterized by the use of 193 nm ultraviolet radiation patternwise exposure.

The resist compositions of the invention generally comprise (a) an imaging polymer component, and (b) a radiation-sensitive acid generator, the imaging polymer component comprising an acid-sensitive polymer having monomeric units having a pendant remote acid labile group. Preferred monomeric units containing the remote acid labile group may be represented by the structure:

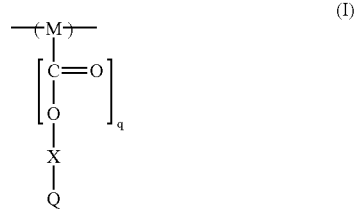

(I)

wherein:
  (i) X is an alkylene or an alkylene ether,
  (ii) M is polymerizing backbone moiety independently selected from the group consisting of cyclic olefin and ethylenic backbone moieties,
  (iii) q is equal to 0 or 1, and
  (iv) Q is a group containing a remote acid labile moiety.

The acid-sensitive polymer may contain other monomeric units as described below which may affect the choice of backbone unit M on the basis of ease of polymerization. Another consideration regarding the selection of M relates to the preference that the acid-sensitive polymer contain (i) cyclic olefin monomeric units in the polymer backbone (i.e., the polymerizable portion of monomeric units making up the polymer), and/or (ii) alicyclic moieties pendant from monomeric units making up the polymer. Thus, if there were no other monomeric units in the polymer which contained cyclic olefin polymerizing moieties and end group Q did not contain an alicyclic moiety, then M would preferably be a cyclic olefin. Otherwise, the acid-sensitive polymer is generally open to M being selected from any suitably polymerizable moiety which is compatible with the other monomers in the acid-sensitive polymer and the intended end use of the composition as a resist.

Examples of some possible M moiety structures (II) are illustrated below:

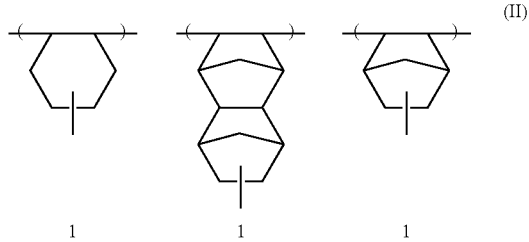

(II)

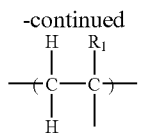

where position 1 represents a bond to X or to a carboxyl moiety and $R_1$ is preferably selected from H, CN, $CH_3$ or $CF_3$. It should be understood that these structures are intended as non-limiting examples. It may be possible to substitute for one or more of the hydrogens on the M backbone moieties, e.g., with a $C_1$–$C_6$ linear or branched alkyl, as long as the performance of the monomeric unit and resulting polymer is not adversely affected.

X is preferably a $C_1$–$C_6$ alkylene or an acyclic R—O—R' ether where R and R' are each independently selected from linear and branched $C_1$–$C_6$ alkylenes. Where X is part of an ester group (i.e., where q equals 1), X is preferably a $C_1$–$C_3$ alkylene, more preferably a $C_1$ alkylene. Where q is zero, X is preferably a $C_4$–$C_6$ alkylene, more preferably a linear or branched $C_4$–$C_6$ alkylene, most preferably a $C_4$–$C_6$ linear alkylene.

Q comprises a remote acid labile moiety. The invention is not limited to any specific species of acid labile moiety. The remote acid labile moiety is preferably selected from the group consisting of tertiary alkyl (or cycloalkyl) esters (e.g., t-butyl, methyl cyclopentyl, methyl cyclohexyl, methyl adamantyl, etc.), ketals, and acetals. Where the presence of bulky alicyclic moieties is desired, Q preferably contains one or more bulky constituents such as saturated alicyclic structures (e.g., adamantyl). Q preferably is free of unsaturated carbon-carbon bonds.

The acid-sensitive polymer may be a homopolymer of the remote acid labile group-containing monomeric unit described above or may contain other additional monomeric units. For example, the acid-sensitive polymer may contain one or more of the following: (a) cyclic olefin or acrylic monomeric units containing acid labile moieties other than a remote acid labile moiety which inhibit the solubility of the resist in aqueous alkaline solutions, (b) cyclic olefin or acrylic monomeric units having polar moieties which promote solubility in aqueous alkaline solutions, (c) cyclic olefin monomeric units having pendant lactone moieties such as those described in U.S. Pat. No. 6,251,560, the disclosure of which is incorporated herein by reference, (d) other cyclic olefin or acrylic monomeric units not falling under (a)–(c), e.g., monomeric units having no pendant moieties, pendant moieties which are non-polar and non-acid labile, etc., (e) non-(cyclic olefin), non-acrylic monomeric units capable of undergoing free-radical copolymerization with the remote acid labile group-containing monomer, such as maleimides, anhydrides (e.g., maleic anhydride), fumarate, and acrylonitrile, and/or (f) non-(cyclic olefin), non-acrylic monomeric units capable of undergoing addition polymerization with said remote acid labile moiety-containing monomeric units.

As noted above, the selection of M of the remote acid labile group-containing monomer and the selection of any other monomers to be contained in the acid-sensitive polymer is preferably such that the imaging polymer component contains cyclic olefin backbone units and/or alicyclic moieties in at least some pendant groups.

In monomeric units (a), preferred acid-labile protecting moieties are selected are selected from the group consisting of tertiary alkyl (or cycloalkyl) esters (e.g., t-butyl, methyl cyclopentyl, methyl cyclohexyl, methyl adamantyl), ester ketals, and ester acetals. Tertiary butyl ester and methyl cyclohexyl ester are a most preferred acid-labile protecting moieties. If desired, combinations of monomeric units (a) having differing protecting functional groups may be used. Monomeric unit (a) is most preferably a methyl cyclopentyl acrylate.

In monomeric units (b), the acidic polar moieties preferably have a $pK_a$ of about 13 or less. Preferred acidic polar moieties contain polar groups selected from the group consisting of carboxyl, sulfonamidyl, fluoroalcohol, and other acidic polar groups. Preferred acidic polar moieties are carboxyl groups. If desired, combinations of monomeric units (b) having differing acidic polar functional groups may be used.

In general, for lithographic applications used in the manufacture of integrated circuit structures and other microscopic structures, the acid-sensitive polymers of invention preferably comprise at least about 10 mole % of remote acid labile group-containing monomeric units, more preferably about 10–50 mole %, most preferably about 20–40 mole %. Otherwise, the amount of other constituents in the acid-sensitive polymer preferably are those found in polymers for resist formulations used with 193 nm imaging radiation (i.e., the remote acid labile group-containing monomeric units being used instead of at least a portion of the acid-labile moiety-containing monomeric units in those polymers—e.g., to achieve a of total acid labile moiety-containing monomeric units on the order of 20–60 mol %). Thus, for example, in the polymers described in U.S. Pat. Nos. 5,843,624; 6,124,074; 6,177,228; 6,251,560, and Japanese Published Patent Application No. JP2001356482A (published Dec. 26, 2001), the disclosures of which are incorporated herein by reference, the specified monomeric units containing acid-labile moieties could be replaced at least in part with remote acid labile group-containing monomeric units. It should be understood that the invention is not limited to the use of remote acid labile group-containing monomeric units in any specific acid-sensitive polymer or specific resist formulation.

Some examples of acid-sensitive polymers of the invention are shown by (A)–(D) below:

(A)

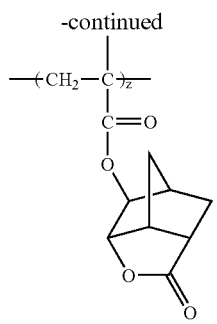

-continued

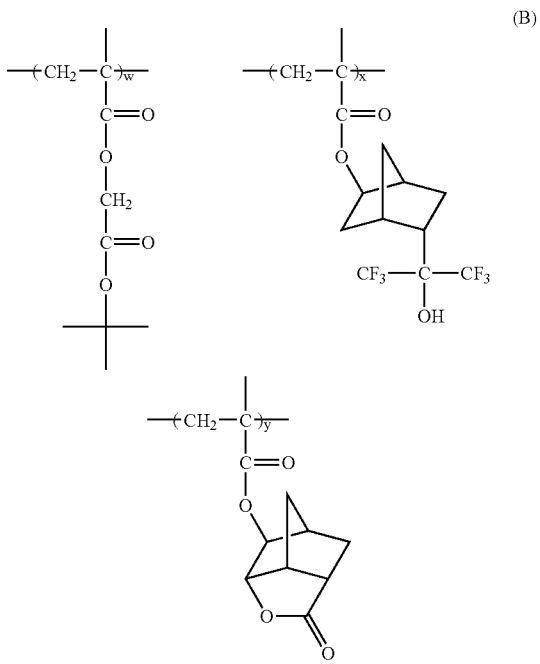

where w, x and y are preferably about 20 and z is about 40;

(B)

where w, x and y are preferably about 40, 20 and 40, respectively;

(C)

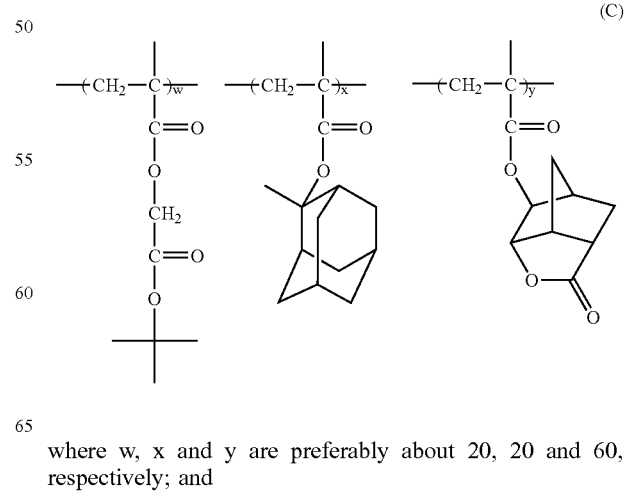

where w, x and y are preferably about 20, 20 and 60, respectively; and

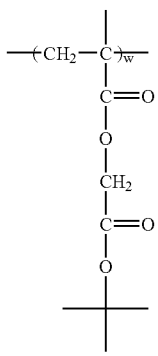 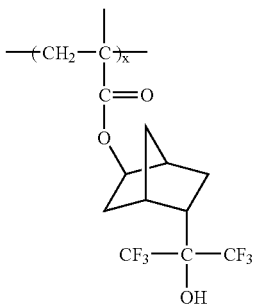

(D)

where w and x are preferably about 40 and 60, respectively.

The invention further encompasses imaging polymer components wherein the acid-sensitive polymer of the invention having remote acid labile moieties is blended with another acid sensitive polymer such as shown in Example 4 below. In such instances, the acid-sensitive polymer of the invention preferably forms at least 10 wt. % of the total imaging polymer component, more preferably 15 wt. %–85 wt. %. The invention also encompasses compositions where the acid-sensitive polymer having remote acid labile moieties makes up the entire imaging polymer component.

In addition to the imaging polymer component, the resist compositions of the invention contain a radiation-sensitive (photosensitive) acid generator. The invention is not limited to the use of any specific acid generator or combination of acid generators, that is the benefits of the invention may be achieved using various acid generators known in the art. Preferred acid generators are those which contain reduced amounts (or preferably zero) aryl moieties. Where aryl-containing acid generator is employed, the absorptive characteristics of the acid generator at 193 nm may restrict the amount of acid generator that can be included in the formulation.

Examples of suitable acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α–α' bis-sulfonyl diazomethanes, naphthoquinone-4-diazides, alkyl disulfones and others.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate (PGMEA) and cyclohexanone.

The compositions of the invention may further contain minor amounts of auxiliary components such as dyes/sensitizers, base additives, bulky hydrophobic additives, etc. as are known in the art. Preferred base additives are weak bases which scavenge trace acids while not having an excessive impact on the performance of the resist. Preferred base additives are (aliphatic or alicyclic) tertiary alkyl amines, aromatic amines, or t-alkyl ammonium hydroxides such as t-butyl ammonium hydroxide (TBAH). Preferred bulky hydrophobic additives are bisacrylate additives such as those disclosed in U.S. Pat. No. 6,124,074, the disclosure of which is incorporated herein by reference.

The resist compositions of the invention preferably contain about 0.5–20 wt. % (more preferably about 3–15 wt. %) acid generator based on the total weight of imaging polymer in the composition. Where a solvent is present, the overall composition preferably contains about 50–90 wt. % solvent. The composition preferably contains about 1 wt. % or less of said base additive based on the total weight of imaging polymer.

The remote acid labile group-containing monomers and other monomers used in the present invention may be synthesized by known techniques. For example, where M is an ethylenic moiety, a remote acid labile group-containing monomer structure (III) below can be obtained from commercial sources.

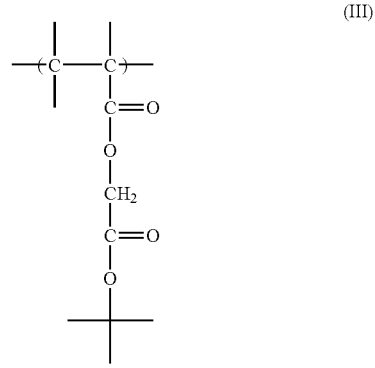

(III)

Where the remote acid labile group-containing polymer has an ethylenic backbone, an example of a polymerization processes using free radical polymerization are illustrated in Examples 1 and 2 below.

The invention is not limited to any specific method of synthesizing the imaging polymers used in the invention. Preferably, the imaging polymers are formed by addition polymerization or free radical polymerization. Examples of other suitable techniques for cyclic olefin polymers and other polymers are disclosed in U.S. Pat. Nos. 5,468,819, 5,705,503, 5,843,624 and 6,048,664, the disclosures of which are incorporated herein by reference. The imaging polymers of the invention preferably have a weight average molecular weight of about 5,000–100,000, more preferably about 10,000–50,000. While the invention has been described in terms of a remote acid labile group-containing monomer, it should be understood that invention also encompasses imaging polymers where the remote acid labile group is formed on the polymer after polymerization.

The resist compositions of the invention can be prepared by combining the imaging polymer, acid generator, and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using 193 nm UV radiation. Where use of other radiation (e.g. mid-UV, 248 nm deep UV, x-ray, or e-beam) is desired, the compositions of the invention can be adjusted (if necessary) by the addition of an appropriate dye or sensitizer to the composition. The general use of the resist compositions of the invention in lithography for semiconductors is described below.

Semiconductor lithographic applications generally involve transfer of a pattern to a layer of material on the semiconductor substrate. The material layer of the semiconductor substrate is preferably selected from the group consisting of organic dielectrics, metals, ceramics, semiconductors or other material depending on the stage of the manufacture process and the desired material set for the end product. In many instances, an antireflective coating (ARC) is applied over the material layer before application of the resist layer. The ARC layer may be any conventional ARC which is compatible with acid catalyzed resists.

Typically, the solvent-containing resist composition is applied to the desired semiconductor substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist. Preferably, the pre-exposure bake is performed at temperatures which are at least 20° C. below $T_g$.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 .millijoules/cm$^2$).

After the desired patternwise exposure, the resist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art. The compositions of the invention enable the reproduction of lithographic features The pattern from the resist structure may then be transferred to the material (e.g., ceramic, metal or semiconductor) of the underlying substrate. Typically, the transfer is achieved by reactive ion etching or some other etching technique. In the context of reactive ion etching, the etch resistance of the resist layer is especially important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,169, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

SYNTHESIS EXAMPLE 1

Synthesis of t-butyl-2-methacryloyloxyacetate (C1-tBE) Monomer

Methacrylic acid (8.06 g, 0.10 mole), t-butyl bromoacetate (19.50 g, 0.10 mole) and 1,8-diazabicyclo[5.4.0]undoc-7-ene, DBU, (15.20 g, 0.10 mole) and 150 ml toluene were combined in a 500 ml 3-neck flask equipped with condenser, nitrogen inlet, thermometer and magnetic stirrer bar. The reaction mixture was stirred at room temperature for one hour. The reaction was continued at 90° C. overnight under a blanket of N$_2$ flow. The mixture was cooled to room temperature and the salt was removed by filtration. The toluene solution was washed with 75 ml saturated NaCl solution and 2×75 ml Dl-water respectively before dried on MgSO$_4$ overnight. The solid was filtered out and the toluene was removed at rotavap. An oily residue was distilled to a final clear liquid at reduced pressure.

SYNTHESIS EXAMPLE 2

Synthesis of C1-tBE:NLM Copolymer

T-butyl-2-methacryloyloxyacetate, "C1-tBE" (7.5 grams, 0.037 mole), norbornenelactonemethacrylate, "NLM"

(12.48 grams, 0.056 mole), 2,2'-azobisisobutylonitrile initiator (0.90 grams, 6.00% total moles), 95 ml of tetrahydrofuran and 50 ml of ethyl acetate were combined in a 250 ml 3-neck round bottom flask equipped with condenser, thermometer, nitrogen inlet and a magnetic stirrer bar. The reaction solution was stirred at room temperature and bubbled with $N_2$ flow for one hour prior turning the heating mantle on. The polymerization was carried out at 70° C. for 14 hours with a blanket of $N_2$ flow. The solution was cooled and added drop wise to 1200 ml stirring methanol. The mixture was stirred overnight before filtration. The copolymer which was collected on the filter was air dried for a few hours before the final drying at vacuum oven at 65° C. The yield was 89%. $C^{13}$ NMR confirmed the composition of the polymer to be 37:63 (C1-tBE:NLM). GPC indicated a Mw of 17,000. The wt. loss % by TGA was 10.25%.

SYNTHESIS EXAMPLE 3

Synthesis of C1-tBE:NLM:MAdMA Terpolymer

T-butyl-2-methacryloyloxyacetate, "C1-tBE" (1.38 grams, 0.0074 mole), methyladamantylmethacrylate, "MAdMA" (1.76 grams, 0.0074 mole), norbornenelactonemethacrylate, "NLM" (5.88 grams, 0.0224 mole), 2,2'-azobisisobutylonitrile initiator (0.40 gram, 6.75% total of moles), 40 ml of tetrahydrofuran, and 20 ml of ethyl acetate were combined in a 250 ml 3-neck, round bottom flask equipped with condenser, thermometer, nitrogen inlet and magnetic stirrer bar. The mixture was stirred at room temperature and bubbled with $N_2$ flow for 45 minutes prior turning the heating mantle on. The reaction was conducted for 14 hours at 70° C. with a blanket of $N_2$ flow. Then the reaction solution was cooled to room temperature and added drop wise to 500 ml of stirring methanol. The resulting slurry was stirred overnight before filtration. The solid was collected from the filter and air dried for five hours. The final drying was carried out in a vacuum oven at 65° C. overnight. The yield was 86%. The polymer was characterized using $C^{13}$ NMR 18:19:63 (C1-tBE:MAdMA:NLM) and had a GPC molecular weight of 10500.

SYNTHESIS EXAMPLE 4

Synthesis of C1-tBE:NLM:NB-HFAMA Terpolymer

T-butyl-2-methacryloyloxyacetate, "C1-tBE" (5.58 grams, 0.030 mole), norbornenehexaflouroalcoholmethacrylate, "NB-HFAMA" (5.22 grams, 0.015 mole), norbornenelactonemethacrylate, "NLM" (6.66 grams, 0.030 mole), 2,2'-azobisisobutylonitrile initiator (0.86 gram, 0.005 mole), 84 ml of tetrahydrofuran and 46 ml of ethyl acetate were combined in a 250 ml 3-neck, round bottom flask equipped with condenser, thermometer, nitrogen inlet and magnetic stirrer bar. The reaction mixture was stirred and bubbled with $N_2$ flow at room temperature for one hour prior tuning the heating mantle on. The polymerization was carried out at 70° C. for 14 hours under a blanket of $N_2$ flow. The reaction solution was cooled to room temperature and added drop wise to 1 liter of stirring hexane. The resulting slurry was stirred overnight before filtration. The polymer was air dried on the filter for a few hours before the final drying at vacuum oven at 65° C. for 24 hours. The yield was 94%. The terpolymer was characterized using $C^{13}$ NMR, 41:40:19 (C1-tBE:NLM:NB-HFAMA).

RESIST EXAMPLE 1

A terpolymer comprising of 20 mol % c1-TBE-MA, 20 mol % methyl adamantyl methacrylate and 60 mol % of NLM was dissolved in propylene glycol monomethyl ether acetate (PGMEA) with 5 wt. % (based on wt. of terpolymer) of di(t-butylphenyl) iodonium perfluorooctane sulfonate and 0.11 wt. % (based on wt. of terpolymer) of 1-t-butyloxycarbonyl 2-phenyl benzimidazole to make a solution of 11 wt. % solids content. The resulting solution was filtered through 0.2 μm filter. The resulting solution was then spin coated on a 8 inch silicon wafer pre-coated with a 82 nm thick bottom antireflective coating (ARC—"AR19" from Shipley Company). The resist coated wafer was then baked at 130° C. for 60 seconds and then exposed to ArF (193 nm wavelength) imaging radiation on an ASML stepper (0.75NA). The exposed resist was then baked at 130° C. for 90 seconds. The image was developed using a single spray puddle develop process for 60 seconds with 0.263 N TMAH developer (Moses Lake's AD-10). Under these process conditions, the 80 nm lines on a 245 nm pitch were resolved.

RESIST EXAMPLE 2

A terpolymer comprising of 40 mol % c1-TBE-MA, 15 mol % NBHFA-MA and 60 mol % of NLM was dissolved in PGMEA with 8 wt. % of BNBS perfluorooctane sulfonate and 0.26 wt. % 2,6-diisopropyl aniline to make a solution of 11 wt. % solid content. The resulting solution was filtered through 0.2 μm filter. The resulting resist formulation was then spin coated on a 8 inch silicon wafer pre-coated with a 82 nm thick bottom ARC ("AR19" from Shipley Company). The resist coated wafer was then baked at 130° C. for 60 seconds and then exposed to ArF (193 nm wavelength) imaging radiation on an ASML stepper (0.75NA). The exposed resist was then baked at 130° C. for 90 seconds. The image was developed using a single spray puddle develop process for 60 seconds with 0.263 N TMAH developer (Moses Lake's AD-10). Under these process conditions, the 90 nm nested lines on a 1:1 pitch were resolved.

RESIST EXAMPLE 3

A copolymer comprising of 40 mol % c1-TBE-MA and 60 mol % of NLM was dissolved in PGMEA with 5 wt. % of 4-n-butoxy-1-naphtyltetrahydrothiophenium perfluorooctane sulfonate and 0.2 wt. % 1-t-butyloxycarbonyl 2-phenyl benzimidazole to make a solution of 13 wt. % solids content. The resulting solution was filtered through 0.2 μm filter. The resulting resist formulation was then spin coated on a 8 inch silicon wafer pre-coated with a 82 nm thick bottom ARC ("AR19" from Shipley Company). The resist coated wafer was then baked at 130° C. for 60 seconds and then exposed to ArF (193 nm wavelength) imaging radiation on an ASML stepper (0.75NA). The exposed resist was then baked at 130° C. for 90 seconds. The image was developed using a single spray puddle develop process for 60 seconds with 0.263 N TMAH developer (Moses Lake's AD-10). Under these process conditions, the 100 nm lines on a 420 nm pitch were resolved.

RESIST EXAMPLE 4

A 15 wt. % copolymer of 40 mol % c1-TBE-MA and 60 mol % of NLM blending with 85 wt. % of a copolymer of 40 mol % methyl adamantyl methacrylate and 60 mol % of NLM was dissolved in a mixture solvents of 95% PGMEA and 5% γ-butyrolactone then blended with 8 wt. % of 4-n-butoxy-1-naphtyltetrahydrothiophenium perfluorooctane sulfonate, 0.26 wt. % 2,6-diisopropyl aniline and 5 wt. % carbo-t-butoxymethyl deoxycholate to make a solution of 11 wt. % solid content. The resulting solution was filtered through 0.2 μm filter. The resulting solution was then spin coated on a 8 inch silicon wafer pre-coated with a 82 nm thick bottom ARC ("AR19" from Shipley Company). The resist coated wafer was then baked at 130° C. for 60 seconds and then exposed to ArF (193 nm wavelength) imaging radiation on an ASML stepper (0.75NA). The exposed resist was then baked at 130° C. for 90 seconds. The image was developed using a single spray puddle develop process for 60 seconds with 0.263 N TMAH developer (Moses Lake's AD-10). Under these process conditions, the 80 nm lines on a 245 nm pitch were resolved.

What is claimed is:

1. A positive resist composition for 193 nm lithography processes, said resist comprising (A) a silicon-free imaging polymer component, and (B) a radiation sensitive acid generator, said imaging polymer component comprising an acid-sensitive polymer having:
   (a) acid labile moiety-containing monomeric units of the structure:

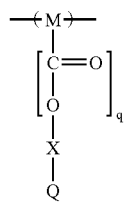

wherein:
   (i) X is an alkylene or an alkylene ether,
   (ii) M is an ethylenic backbone moiety,
   (iii) q is equal to 0 or 1, and
   (iv) Q is a group containing a remote acid labile moiety independently selected from the group consisting of t-butyl ester, methyl cyclohexyl ester, methyl adamantyl ester and combinations thereof;
   (b) acrylic monomeric units having a pendant polar moiety other than lactone selected from fluoroalcohol groups which promote solubility in aqueous alkaline solutions; and
   (c) norbornenelactonemethacrylate monomeric units.

2. The composition of claim 1 wherein X is an alkylene spacer containing at least three carbon atoms.

3. The composition of claim 1 wherein q is equal to 1, and said alkylene comprises an alkylene moiety having one to three carbon atoms.

4. The composition of claim 1 wherein said acid sensitive polymer further comprises at least one monomeric unit selected from the group consisting of acrylic monomeric units containing acid labile moieties, other than a remote acid labile moiety, which inhibit the solubility of the resist in aqueous alkaline solutions.

5. The composition of claim 1 wherein said acid-sensitive polymer contains at least about 10 mole % of remote acid labile moiety-containing monomeric units.

6. The composition of claim 1 wherein said imaging polymer component further comprises an additional acid-sensitive polymer not having remote acid-labile moieties.

7. The composition of claim 6 wherein said imaging polymer component comprises at least 10 wt. % of said acid-sensitive polymer having remote acid-labile moieties.

8. The composition of claim 1 wherein said resist composition contains at least about 0.5 wt. % of said radiation sensitive acid generator based on the weight of said imaging polymer.

9. A method of forming a patterned material structure on a substrate, said material being selected from the group consisting of semiconductors, ceramics and metals, said method comprising:
   (A) providing a substrate with a layer of said material,
   (B) applying a resist composition to said substrate to form a resist layer on said substrate, said resist composition comprising (a) a silicon-free imaging polymer component, and (b) a radiation sensitive acid generator, said imaging polymer component comprising an acid-sensitive polymer comprising
       (1) acid labile moiety-containing monomeric units of the structure:

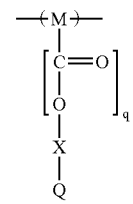

wherein:
       (i) X is an alkylene or an alkylene ether,
       (ii) M is an ethylenic backbone moiety,
       (iii) q is equal to 0 or 1, and
       (iv) Q is a group containing a remote acid labile moiety independently selected from the group consisting of t-butyl ester, methyl cyclohexyl ester, methyl adamantyl ester and combinations thereof;
       (2) acrylic monomeric units having a pendant polar moiety other than lactone selected from fluoroalcohol groups which promote solubility in aqueous alkaline solutions; and
       (3) norbornenelactonemethacrylate monomeric units;
   (C) patternwise exposing said substrate to 193 nm radiation whereby acid is generated by said acid generator in exposed regions of said resist layer by said radiation,
   (D) contacting said substrate with an aqueous alkaline developer solution, whereby said exposed regions of said resist layer are selectively dissolved by said developer solution to reveal a patterned resist structure, and
   (E) transferring resist structure pattern to said material layer, by etching into said material layer through spaces in said resist structure pattern.

10. The method of claim 9 wherein said etching comprises reactive ion etching.

11. The method of claim 9 wherein at least one intermediate layer is provided between said material layer and said resist layer, and step (E) comprises etching through said intermediate layer.

12. The method of claim 9 wherein said substrate is baked between steps (C) and (D).

13. The method of claim 9 wherein said imaging polymer component further comprises an additional acid-sensitive polymer not having remote acid-labile moieties.

14. The method of claim 13 wherein said imaging polymer component comprises at least 10 wt. % of said acid-sensitive polymer having remote acid-labile moieties.

* * * * *